United States Patent
Lee et al.

(10) Patent No.: US 10,985,274 B2
(45) Date of Patent: Apr. 20, 2021

(54) REDUCTION OF TOP SOURCE/DRAIN EXTERNAL RESISTANCE AND PARASITIC CAPACITANCE IN VERTICAL TRANSISTORS

(71) Applicant: INTERNATIONAL BUSINESS MACHINES CORPORATION, Armonk, NY (US)

(72) Inventors: Choonghyun Lee, Rensselaer, NY (US); Kangguo Cheng, Schenectady, NY (US); Juntao Li, Cohoes, NY (US); Shogo Mochizuki, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/845,350

(22) Filed: Apr. 10, 2020

(65) Prior Publication Data
US 2020/0243681 A1     Jul. 30, 2020

Related U.S. Application Data

(62) Division of application No. 16/144,196, filed on Sep. 27, 2018, now Pat. No. 10,680,102.

(51) Int. Cl.
*H01L 29/78* (2006.01)
*H01L 29/06* (2006.01)
(Continued)

(52) U.S. Cl.
CPC .. *H01L 29/7827* (2013.01); *H01L 21/823493* (2013.01); *H01L 21/823885* (2013.01);
(Continued)

(58) Field of Classification Search
CPC ........... H01L 29/7827; H01L 29/66666; H01L 29/045; H01L 29/0649; H01L 21/823493; H01L 21/823885
See application file for complete search history.

(56) References Cited

U.S. PATENT DOCUMENTS

| | | |
|---|---|---|
| 8,637,930 B2 | 1/2014 | Ando et al. |
| 9,305,835 B2 | 4/2016 | Alptekin et al. |

(Continued)

OTHER PUBLICATIONS

Chang, L. et al., "CMOS Circuit Performance Enhancement by Surface Orientation Optimization" IEEE Transactions on Electron Devices (Oct. 2004) pp. 1621-1627, vol. 51, No. 10.
(Continued)

*Primary Examiner* — Phat X Cao
(74) *Attorney, Agent, or Firm* — Tutunjian & Bitetto, P.C.; Douglas Pearson

(57) ABSTRACT

A method of forming a semiconductor device that includes forming at least two semiconductor fin structures having sidewalls with {100} crystalline planes that is present atop a supporting substrate; and epitaxially growing a source/drain region in a lateral direction from the sidewalls of each fin structure. The second source/drain regions have substantially planar sidewalls. A metal wrap around electrode is formed on an upper surface and the substantially planar sidewalls of the source/drain regions. Air gaps are formed between the source/drain regions of the at least two semiconductor fin structures.

20 Claims, 8 Drawing Sheets

(51) Int. Cl.
    *H01L 29/04*       (2006.01)
    *H01L 29/66*       (2006.01)
    *H01L 21/8238*    (2006.01)
    *H01L 21/8234*    (2006.01)
    *H01L 29/161*     (2006.01)
    *H01L 29/423*     (2006.01)
    *H01L 29/08*       (2006.01)

(52) U.S. Cl.
    CPC ........ *H01L 29/045* (2013.01); *H01L 29/0649* (2013.01); *H01L 29/0847* (2013.01); *H01L 29/161* (2013.01); *H01L 29/423* (2013.01); *H01L 29/66666* (2013.01)

(56) References Cited

U.S. PATENT DOCUMENTS

| | | |
|---|---|---|
| 9,355,887 B2 | 5/2016 | Chan et al. |
| 9,368,572 B1 | 6/2016 | Cheng et al. |
| 9,443,982 B1 | 9/2016 | Balakrishnan et al. |
| 9,508,799 B2 | 11/2016 | Weng et al. |
| 9,735,246 B1 | 8/2017 | Basker et al. |
| 9,773,913 B1 | 9/2017 | Balakrishnan et al. |
| 9,859,166 B1 | 1/2018 | Cheng et al. |
| 2015/0303118 A1 | 10/2015 | Wang et al. |
| 2018/0122800 A1* | 5/2018 | Cheng ................... H01L 21/764 |
| 2018/0248046 A1* | 8/2018 | Wu ................... H01L 29/66666 |

OTHER PUBLICATIONS

List of IBM Patents or Patent Applications Treated as Related dated Apr. 10, 2020, 2 pages.

* cited by examiner

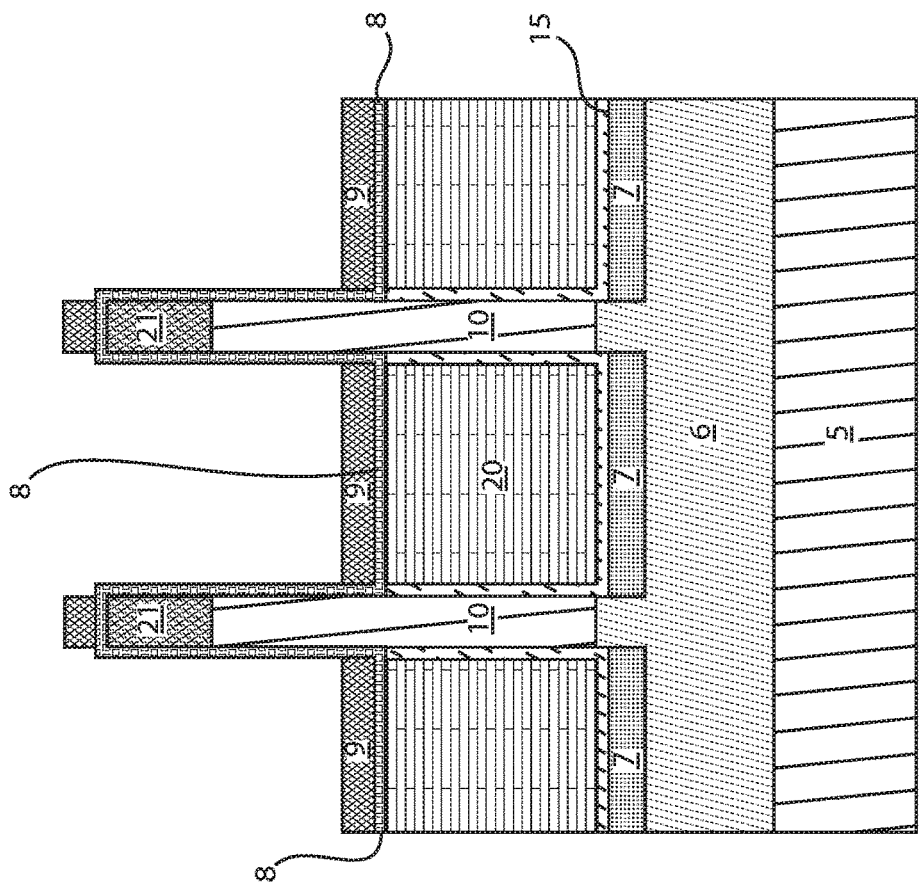
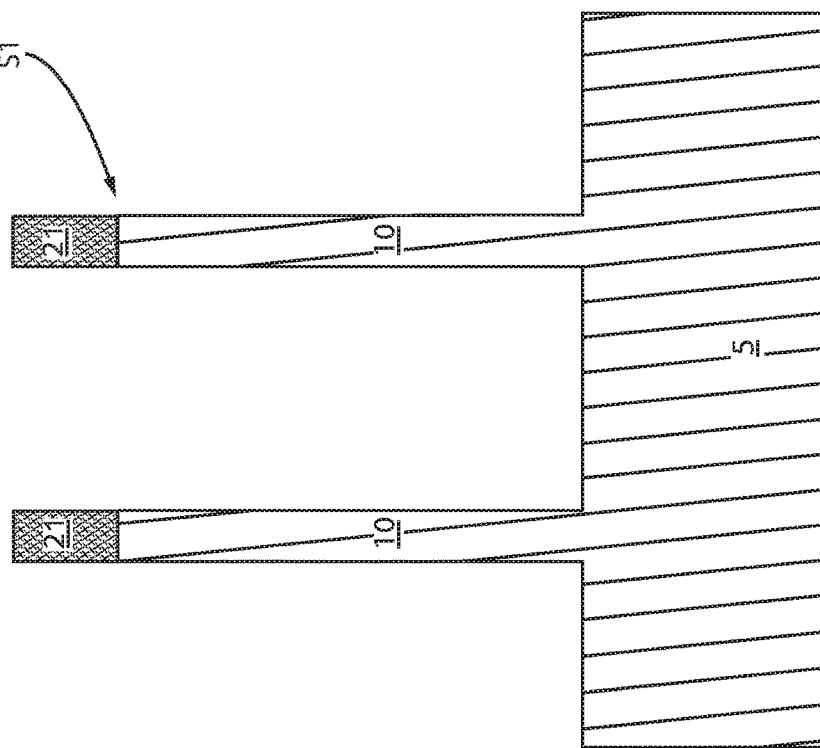

(12)  US 10,985,274 B2

REDUCTION OF TOP SOURCE/DRAIN EXTERNAL RESISTANCE AND PARASITIC CAPACITANCE IN VERTICAL TRANSISTORS

BACKGROUND

Technical Field

The present invention generally relates to vertically orientated semiconductor devices, and more particularly to vertical field effect transistors (VFETs).

Description of the Related Art

The dimensions of semiconductor field effect transistors (FETs) have been steadily shrinking, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance improvements. One such class of device is a fin field effect transistor (FinFET).

SUMMARY

In one aspect, a method is described herein for forming a wrap around contact in a vertical field effect transistor (VFET) structure to reduce the external resistance at the top source/drain region of a VFET device. In one embodiment, a method of forming a semiconductor device is provided that includes providing a semiconductor fin structure having sidewalls with {100} crystalline planes that is present atop a supporting substrate. A first source/drain region is formed on the supporting substrate at a base of the fin structure. A gate structure is formed on a vertically orientated channel region portion of the fin structure over the first source/drain region. A second source/drain region is epitaxially grown in a lateral direction from the sidewalls of the semiconductor fin structure having sidewalls with {100} crystalline planes. The second source/drain regions have substantially planar sidewalls. A metal wrap around electrode is formed on an upper surface and the substantially planar sidewalls of the second source/drain region. An air gap may be formed adjacent to the substantially planar sidewalls of the second source/drain region.

In another embodiment, a method of forming a semiconductor device is provided that includes forming at least two semiconductor fin structures having sidewalls with {100} crystalline planes that is present atop a supporting substrate; and epitaxially growing a source/drain region in a lateral direction from the sidewalls of each fin structure. The source/drain regions have substantially planar sidewalls and are present at an end of each of the fin structures opposite an end that is in contact with the supporting substrate. A metal wrap around electrode is formed on an upper surface and the substantially planar sidewalls of the source/drain regions. Air gaps are formed between the source/drain regions of the at least two semiconductor fin structures.

In another aspect, a vertical field effect transistor (VFET) structure is described herein that includes a wrap around contact to reduce the external resistance at the top source/drain region of a VFET device. In one embodiment, the semiconductor device includes at least two semiconductor fin structures having sidewalls with {100} crystalline planes that is present atop a supporting substrate; and a source/drain region extending in a lateral direction from the sidewalls of each fin structure of the at least two semiconductor fin structures having sidewalls with the {100} crystalline planes. The source/drain regions have substantially planar sidewalls and are present at an end of each of the fin structures opposite an end that is in contact with the supporting substrate. A metal wrap around electrode on an upper surface and the substantially planar sidewalls of the source/drain regions. Air gaps between the source/drain regions of the at least two semiconductor fin structures.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 2 is a side cross-sectional view depicting forming a semiconductor fin structure having sidewalls with {100} crystalline planes that is present atop a supporting substrate.

FIG. 3 is a side cross-sectional view depicting forming a first source/drain region on the supporting substrate at a base of the fin structure; and forming a gate structure on a vertically orientated channel region portion of the fin structure over the first source/drain region, in accordance with one embodiment of the present disclosure.

DETAILED DESCRIPTION

Figure 1:
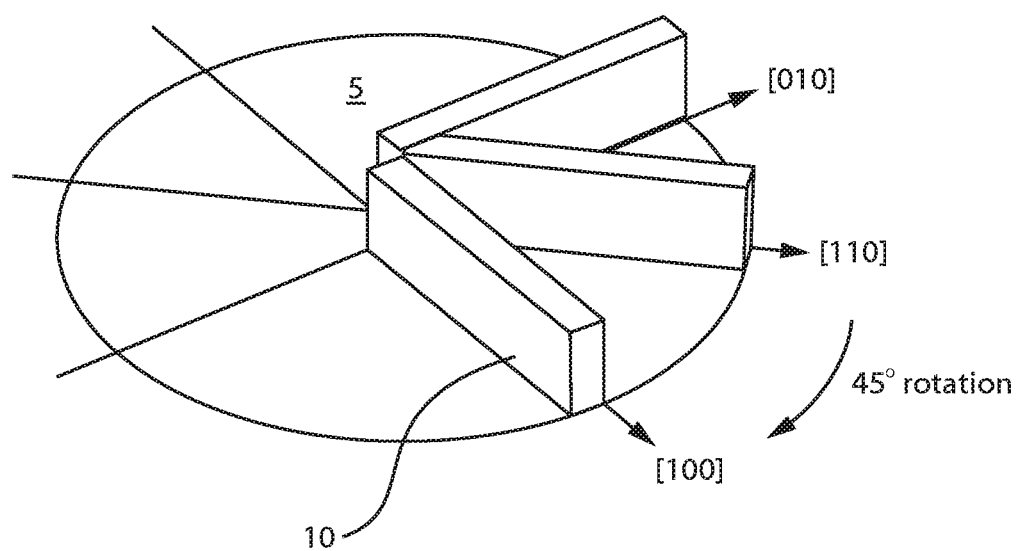
FIG. 1 is a perspective view illustrating the crystal orientations of a rotated semiconductor substrate according to embodiments of the present invention, in which etching the substrate following rotation of approximately 45 degrees can provide fin structures having sidewalls with {100} crystalline planes.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, a "fin structure" refers to a semiconductor material, which is employed as the body of a semiconductor device, in which the gate structure is positioned around the fin structure such that charge flows down the channel of the fin structure. A vertical FET (VFET) semiconductor device has the drain, fin channel, and source device components arranged perpendicular to the plane of the substrate surface, which is referred to as a vertical stack (also referred to as vertical FET).

Vertical transport FETs (VFET) have potential advantages over conventional FinFETs in terms of density, performance, power consumption, and integration. However, device performance of VFET is limited by external resistance at the top source/drain due to the difficulty in forming source/drain (S/D) epitaxy and silicide on a thin fin structure. A possible solution is to form wrap-around-contact (WAC), i.e., metal contact wrapping around the source/drain epitaxy. To render wrap-around-contact (WAC) effective, however, a high quality and large volume of source/drain (S/D) epitaxy is essential. It has been determined that the large source/drain (S/D) epitaxy with wrap-around-contact (WAC), unfortunately, comes with the drawback of large overlap between the source/drain and the metal gate, resulting in the increase of parasitic capacitance. Ideally, reductions in both parasitic resistance and capacitance are desired for improving transistor performance. Due to the competing requirements of large source/drain (S/D) epitaxy to reduce resistance and small source/drain (S/D) epitaxy to reduce parasitic capacitance, it is nontrivial to achieve both low resistance and low parasitic capacitance at the same time.

As will be described herein, a method and structure are provided in which a wrap-around-contact is formed in vertical FET structures that reduce the externals resistance at the top source/drain region (S/D) region, which previously limited the device performance. In some embodiments, {100} fin sidewall surfaces in vertical FETs are used with the 45-degree rotation of {100} substrate to enable the lateral epitaxy growth of high-quality top source/drain region from the {100} fin sidewall. A sacrificial layer, e.g., sacrificial $SiO_2$ layer, on top source/drain (S/D) epitaxy is formed by a selective conversion process without oxygen ambient. Wrap-around-contact (WAC) are formed by replacing the sacrificial layer with a thin metal liner. Additionally, airgaps may be created after the formation of wrap-around-contact (WAC) to reduce the parasitic capacitance. As a result, both source/drain resistance and the parasitic capacitance are reduced. The methods and structures of the present disclosure are now discussed with greater detail with reference to FIGS. 1-14.

FIG. 1 illustrates the crystal orientations of a rotated semiconductor substrate 5 according to embodiments of the present invention, in which etching the substrate 5 following rotation of approximately 45 degrees can provide fin structures 10 having sidewalls with {100} crystalline planes on the sidewalls of fin structures 10 to enable lateral top source/drain (S/D) epitaxy to maximize the surface area of the top source/drain (S/D) region. The present invention uses (100) top surfaced single-crystal wafers were the notch is aligned to the <100> direction and the longitudinal axes of the fins are also aligned to the <100> direction. As illustrated in FIG. 1, the {100} fin sidewall surfaces in vertical field effect transistors (VFETs) can be achieved with a 45 degree rotation of the (100) substrate 5.

In crystalline solids, the atoms, which make up the solid, are spatially arranged in a periodic fashion called a lattice. A crystal lattice contains a volume, which is representative of the entire lattice and is regularly repeated throughout the crystal. In describing crystalline semiconductor materials in the present disclosure, the following conventions are used. The directions in a lattice are expressed as a set of three integers with the same relationship as the components of a vector in that direction. For example, in cubic lattices, such as silicon, that has a diamond crystal lattice, a body diagonal exists along the [111] direction with the H brackets denoting a specific direction. Many directions in a crystal lattice are equivalent by a symmetry transformation, depending upon the arbitrary choice of orientation axes. For example, a crystal directions in the cubic lattice [100], [010] and [001] are all crystallographically equivalent. A direction and all its equivalent directions are denoted by < > brackets. Thus, the designation of the <100> direction includes the equivalent

[100], and [001] positive directions as well as the equivalent negative directions [400], [0-10] and [00-1].

Planes in a crystal may also be identified with a set of three integers. They are used to define a set of parallel planes and each set of integers enclosed in ( ) parentheses identifies a specific plane. For example, the proper designation for a plane perpendicular to the [100] direction is (100). Thus, if either a direction or a plane of a cubic lattice is known, its perpendicular counterpart may be quickly determined without calculation.

Many planes in a crystal lattice are equivalent by a symmetry transformation, depending upon the arbitrary choice of orientation axes. For example, the (100), (010) and (001) planes are all crystallographically equivalent. A plane and all its equivalent planes are denoted by { } parentheses. Thus, the designation of the {100} plane includes the equivalent (100), (010) and (001) positive planes as well as the equivalent planes (-100), (0-10) and (00-1).

As noted above, the {100} fin sidewalls enable lateral top source/drain (S/D) epitaxy growth to maximize the surface of the top source/drain (S/D) region. Fin structures having {100} fin sidewalls can be produced in vertical FETs with a 45-degree rotation of a (100) substrate. Following the aforementioned described rotation of the substrate 5, the substrate 5 may be etched to provide the fin structures 10.

FIG. 2 depicts forming a semiconductor fin structure 10 having sidewalls with {100} crystalline planes that is present atop a supporting substrate. In some embodiments, a dielectric cap 25 (also referred to as a hardmask) is present on upper most surface of the vertically oriented channel region that is positioned with the fin structure 10. The dielectric cap 25 is present on the end of the fin structure 10 that is opposite the side of the fin structure 10 that is in direct contact with the substrate 5. In one embodiment, the dielectric cap 25 is composed of a nitride, such as silicon nitride. However, the dielectric cap 25 is not limited to only this example, as any dielectric material may be employed for the dielectric cap 25.

In some embodiments, the substrate 5 is composed of a type IV semiconductor material. By "type IV semiconductor" it is meant that the semiconductor material includes at least one element from Group IVA (i.e., Group 14) of the Periodic Table of Elements. Examples of type IV semiconductor materials that are suitable for the supporting substrate 5 include silicon (Si), germanium (Ge), silicon germanium (SiGe), silicon doped with carbon (Si:C), silicon germanium doped with carbon (SiGe:C) and a combination thereof. In an embodiment, the supporting substrate 5 is a single crystal silicon wafer.

The fin structure 10 can be formed from the substrate 5 using an etch process. Therefore, because the substrate 5 is composed of a type IV semiconductor, the fin structure is also composed of a type IV semiconductor, such as silicon (Si), i.e., single crystal silicon (Si). The above examples of semiconductor materials that are suitable for providing the substrate 5, are suitable for providing examples of materials that can be used for the fin structure 10. In some embodiments, when substrate 5 is composed of a crystalline semiconductor, such as a single crystal semiconductor, e.g., monocrystalline silicon (c-Si), the fin structure 10 will also be composed of monocrystalline silicon.

The pattern and etch processes for forming the fin structure 10 may employ a hard mask, which can provide the dielectric cap. More specifically, a dielectric material layer may be deposited for forming the hard mask, i.e., dielectric cap, atop the substrate 5. The dielectric material layer may then be patterned using photolithography, e.g., by forming a photoresist mask, and etched using an anisotropic etch process, such as reactive ion etch (RIE). Following patterning of the dielectric material layer for forming the hard mask, i.e., dielectric cap, the substrate 5, e.g., crystalline semiconductor material, may be etched to provide the fin structure 10. The etch process for forming the fin structure 10 may be an anisotropic etch, such as reactive ion etch (RIE).

As noted above, because the substrate is a (100) substrate 5 that has been rotated 45 degrees, the sidewalls S1 of the fin structure 10 that is formed by etching the substrate 5 will have {100} crystalline planes, which facilitate lateral epitaxial growth during subsequent process steps for forming the top source/drain region, i.e., second source/drain region.

It is noted that the above subtractive method for defining the geometry of the fin structure 10 is only one example of a method for forming the fin structure 10. In another example, the fin structures 10 may be formed using a sidewall image transfer (SIT) process flow.

Each of the fin structures 10 may have a height ranging from 5 nm to 200 nm. In another embodiment, each of the fin structures 10 has a height ranging from 10 nm to 100 nm. In one example, each of the fin structures 10 has a height ranging from 20 nm to 50 nm. Each of the plurality of fin structures 10 may have a width of less than 20 nm. In another embodiment, each of the fin structures 10 has a width ranging from 3 nm to 8 nm. Although FIG. 2 illustrates forming two fin structures 10, the present disclosure is not limited to only this example, as any number of fin structures 10 may be formed by etching the substrate 5.

FIG. 3 depicts forming a first source/drain region 6 on the supporting substrate 5 at a base of the fin structure 10; and forming a gate structure on a vertically orientated channel region portion of the fin structure over the first source/drain region.

As used herein, the term "drain" means a doped region in semiconductor device located at the end of the channel, in which carriers are flowing out of the transistor through the drain. As used herein, the term "source" is a doped region in the semiconductor device, in which majority carriers are flowing into the channel. Because the source region and the drain region are both provided by doped regions on opposing sides of the channel of the device, and their function as a source region or a drain region is impacted by the bias applied to these regions in the final device structure, the term "source/drain region" is suitable for describing these doped regions in the absence of the bias that designates their type.

The first source/drain region 6 may be composed of a type IV or type III-V semiconductor. The above examples of semiconductor materials that are suitable for providing the supporting substrate 5, are suitable for providing examples of materials that can be used for the first source/drain region 6. In some embodiments, the first source/drain region 6 provides the source region of the device, and the later formed second source/drain region provides the drain region of the device. In some other embodiments, the first source/drain region 6 provides the drain region of the device and the later formed second source/drain region provides the source region of the device. The first source/drain region 6 is typically doped to a conductivity type that provides the conductivity type of the semiconductor device. For example, if the first source/drain region 6 is doped to an n-type conductivity, the semiconductor device is an n-type device, e.g., an n-type vertical FET. For example, if the first source/drain region 6 is doped to a p-type conductivity, the semiconductor device is a p-type device, e.g., a p-type vertical FET.

The first source/drain region 6 may be provided by an upper surface of the supporting substrate 5 that is doped to the required conductivity type using ion implantation. In other embodiments, the first source/drain region 6 may be composed of a semiconductor material that is deposited atop the supporting substrate 5. When the first source/drain region 6 is composed of a deposited material, the semiconductor material that provides the first source/drain region 6 may be epitaxially formed, i.e., formed by an epitaxial growth and/or deposition process. The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial semiconductor material" denotes a material that is formed using epitaxial growth. In some embodiments, when the chemical reactants are controlled, and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. The epitaxial deposition process may employ a chemical vapor deposition apparatus, e.g., plasma enhanced chemical vapor deposition (PECVD), metal organic chemical vapor deposition (MOCVD). In the embodiments, in which the first source/drain region 6 is composed of an epitaxially formed silicon containing material, the silicon gas source for epitaxial deposition may be selected from the group consisting of Silane ($SiH_4$), disilane ($Si_2H_6$), or higher order silanes, hexachlorodisilane ($Si_2Cl_6$), tetrachlorosilane ($SiCl_4$), dichlorosilane ($Cl_2SiH_2$), trichlorosilane ($Cl_3SiH$), and combinations thereof.

To provide the appropriate conductivity type of the first source/drain region 6, the semiconductor material that provides the source/drain region may be doped with an n-type or p-type dopant. As used herein, "p-type" refers to the addition of impurities to an intrinsic semiconductor that creates deficiencies of valence electrons. In a type IV semiconductor material, such as silicon and germanium, examples of p-type dopants, i.e., impurities, include but are not limited to: boron, aluminum, gallium and indium. As used herein, "n-type" refers to the addition of impurities that contributes free electrons to an intrinsic semiconductor. In a type IV semiconductor material, such as silicon or germanium, examples of n-type dopants, i.e., impurities, include but are not limited to antimony, arsenic and phosphorous. In some embodiments, the dopant that dictates the conductivity type of the first source/drain region is introduced in-situ. By "in-situ" it is meant that the dopant that dictates the conductivity type of the semiconductor material that provides the first source/drain region 6 is introduced during the process step, e.g., epitaxial deposition. Alternatively, the dopant that provides the conductivity type of the first source/drain region 6 is introduced by ion implantation. The dopant for the epitaxial semiconductor material that dictates the conductivity type of the first source/drain region is typically present in a concentration ranging from $2 \times 10^{20}$ atoms/$cm^3$ to $2 \times 10^{21}$ atoms/$cm^3$.

Still referring to FIG. 3, following formation of the fin structure 10, the first dielectric spacer 7 may be formed. The first dielectric spacer 7 may be composed of an oxide, nitride or oxynitride material. In some embodiments, the first dielectric spacer 7 is composed of silicon nitride formed using non-conformal deposition processes such as high density plasma (HDP), physical vapor deposition (PVD), chemical vapor deposition (CVD), and plasma enhanced chemical vapor deposition (PECVD).

In some embodiments, a gate structure 15, 20 is present around the vertically orientated channel region that is provided by the fin structure 10. A "gate structure" means a structure used to control output current (i.e., flow of carriers in the channel) of a semiconducting device through electrical fields. The gate structure 15, 20 may include at least one gate dielectric 15, and at least one gate conductor 20. The gate dielectric 15 of the gate structure 15, 20 is first formed on the channel portion of the fin structure 10. The gate dielectric 15 may be composed of any dielectric material, such as an oxide, nitride or oxynitride material. In some embodiments, the gate dielectric is a high-k dielectric material. As used herein, "high-k" denotes a dielectric material featuring a dielectric constant (k) higher than the dielectric constant of $SiO_2$ at room temperature. For example, the least one gate dielectric layer 15 may be composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof.

To provide the conformal layer, the gate dielectric 15 may be deposited using atomic layer deposition (ALD). In other embodiments, the gate dielectric 15 may be deposited using chemical vapor deposition methods, such as plasma enhanced chemical vapor deposition (PECVD).

Following formation of the gate dielectric 15, a work function metal (not shown) may be deposited. The work function metal (not shown) may be selected to provide a p-type work function metal layer and an n-type work function metal layer. In one embodiment, the p-type work function metal layer is composed of titanium nitride (TiN). The p-type work function metal layer may also be composed of TiAlN, Ru, Pt, Mo, Co and alloys and combinations thereof. In one embodiment, the n-type work function metal layer is composed of at least one of TiAl, TaN, TiN, HfN, HfSi, or combinations thereof. It is noted that the work function metal is optional and may be omitted.

The gate conductor 20 may be blanket deposited over the work function metal (when present), as well as over the gate dielectric 15, or directly on the gate dielectric 15 when the work function metal is not present.

In various embodiments, the gate conductor 20 is a metal, where the metal may be tungsten (W), tungsten nitride (WN) or combinations thereof. In one or more embodiments, the gate conductor 20 is tungsten (W). The gate conductor 20 may be deposited by CVD or PECVD or PVD.

FIG. 3 further depicts recessing the gate structure 15, 20. Recessing the gate structure 15, 20 may begin with recessing the gate conductor 20, as well as the portion of the gate dielectric 15 to a depth below the upper surface of the fin structure 10. This etch step may be performed using wet chemical etch or reactive ion etch (RIE).

Still referring to FIG. 3, an etch stop layer 8 may then be formed on the gate structure 15, 20 and the exposed sidewall surfaces of the fin structure 10 and the dielectric cap 25. The etch stop layer 8 may be a conformally deposited layer. The term "conformal" denotes a layer having a thickness that does not deviate from greater than or less than 30% of an average value for the thickness of the layer. The etch stop layer 8 may, for example, comprise a low-k dielectric material (preferably, with a dielectric constant k<5) such as a silicon oxycarbonitride (SiOCN) material, a silicon carbon oxide (SiCO) material, a silicon carbon nitride (SiCN) or a silicon boron carbon nitride (SiBCN) material deposited using a plasma enhanced atomic layer deposition (PEALD) process, an atomic layer deposition (ALD) process, a low pressure chemical vapor deposition (LPCVD) process or a plasma enhanced chemical vapor deposition (PECVD) process with a thickness of 2-15 nm. In one example, the etch stop layer 8 is composed of silicon boron carbon nitride (SiBCN).

In some embodiments, a sacrificial dielectric spacer 9 is formed on the etch stop layer 8, and over the gate structure 15, 20. The sacrificial dielectric spacer 9 does not cover the sidewalls of the fin structures 10. The sacrificial dielectric spacer 9 may be composed of an oxide, nitride or oxynitride material. In some embodiments, the sacrificial dielectric spacer 9 is composed of silicon nitride formed using high density plasma (HDP), chemical vapor deposition (CVD), and plasma enhanced chemical vapor deposition (PECVD). A wet etch-back process may remove any material that is deposited for the sacrificial dielectric spacer 9 from the etch stop layer 8 that is present on the sidewalls of the fin structure 10.

Figure 4:
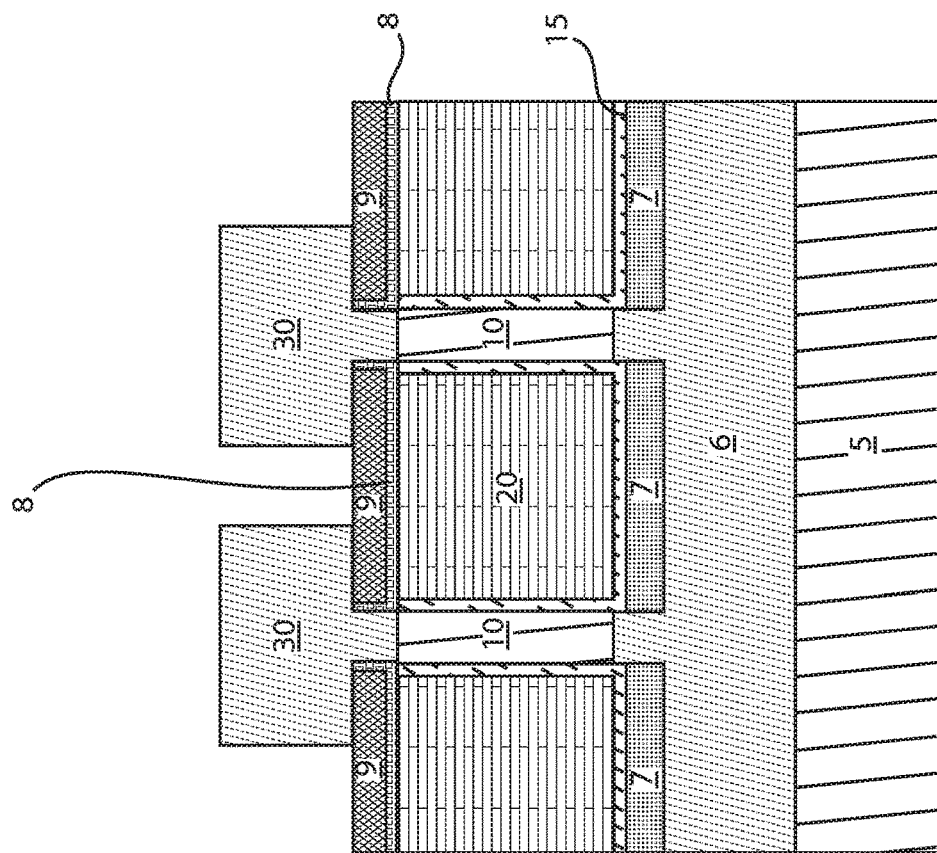
FIG. 4 is a side cross-sectional view depicting one embodiment of epitaxially growing a second source/drain region in a lateral direction from the sidewalls of the semiconductor fin structure having sidewalls with {100} crystalline planes.

FIG. 4 depicts one embodiment of epitaxially growing a second source/drain region 30 in a lateral direction from the sidewalls of the semiconductor fin structure having sidewalls with {100} crystalline planes. Before, forming the second source/drain region 30, the etch stop layer 8 is removed from the sidewalls S1 of the fin structures 10. Epitaxial growth is a selective deposition process. Epitaxial material, i.e., lateral epitaxially grown semiconductor material, as used in the second source/drain region 30 will only form on semiconductor surfaces. The crystal structure of the epitaxially deposited semiconductor material, i.e., the epitaxial deposited semiconductor material for the second source/drain region 30, arranges and aligns with the crystal structure of the semiconductor deposition surface, i.e., the fin structure sidewall S1 having the {100} crystalline planes. This can be referred to as an epitaxial relationship between the deposited material and the deposition surface. The epitaxial material for the second source/drain region 30 will not form on dielectric surfaces, such as the dielectric cap 25 and the sacrificial dielectric spacer 9.

The epitaxial deposition process for forming the second source/drain region 30 is similar to the epitaxial deposition process for forming the first source/drain region 6. Additionally, the second source/drain region 30 may be in situ doped to provide the conductivity type, e.g., n-type or p-type conductivity, of the second source/drain region 30. The in situ doping process for dictating the conductivity type of the second source/drain region 30 is similar to the in situ doping process for introducing the dopant that dictates the conductivity type of the first source/drain region 6. Therefore, the description of the epitaxial deposition process and the in situ doping process that is provided for the first source/drain region may provide at least one embodiment of the epitaxial deposition process and in situ doping process for forming the second source/drain region 30.

In one example, the epitaxial deposited semiconductor material for the second source/drain region 30 may be silicon doped with phosphorus (Si:P) for providing an n-type vertical field effect transistor (VFET). In one example, the epitaxial deposited semiconductor material for the second source/drain region 30 may be silicon germanium doped with boron (SiGe:B) for providing a p-type vertical field effect transistor (VFET). In one example, the n-type or p-type dopant concentration for the second source/drain region 30 ranges from $1 \times 10^{20}$ atoms/cm$^3$ to $5 \times 10^{21}$.

The outside sidewall of the second source/drain region 30 is planar, which results from the lateral epitaxial growth process provided by the {100} fin sidewalls S1. When viewed from the side cross-section that is depicted in FIG. 4, the second source/drain regions have a substantially rectangular geometry. This is distinguishable from facetted epitaxial growth, which results in a pyramid type geometry cross-section having an apex, i.e., peaked or non-planar sidewall, at the sidewall of the epitaxially deposited material. In some embodiments, the width W1 of the second source/drain region 30 measured from the sidewall S1 of the fin structure 10 may be at least twice the width of the fin structure 10.

In some embodiments, the second source/drain region 30 may be implanted with an n-type or p-type dopant using ion implantation. Ion implantation may be substituted for the use of in situ doping to dope the second source/drain region 30 or may be used in combination with in situ doping to dope the second source/drain region 30.

Figure 5:
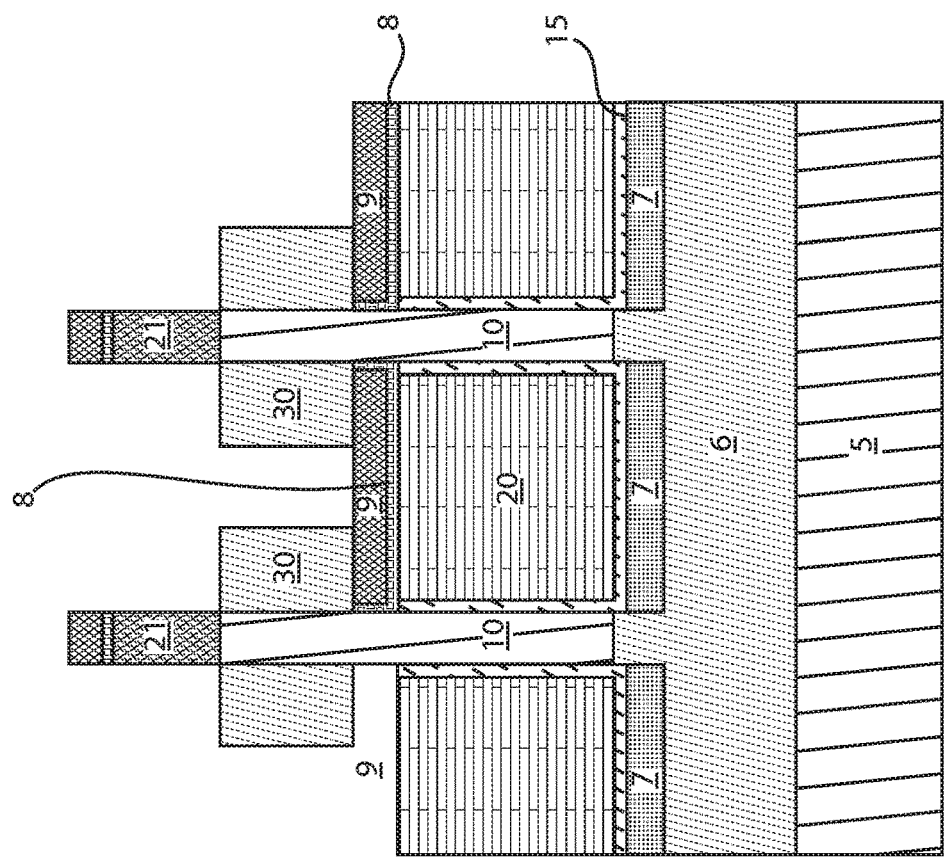
FIG. 5 is a side cross-sectional view depicting applying a drive in anneal to form junctions, in accordance with one embodiment of the present disclosure.

FIG. 5 depicts applying a drive in anneal. The drive in anneal process may be provided by furnace annealing, rapid thermal annealing, laser annealing, flash annealing or a combination thereof. The dopant from the first and second source/drain regions 6, 30 may diffuse into the adjacent portions of the fin structures 10 that the first and second source/drain regions 6, 30 are in contact with forming source and drain extension regions. FIG. 5 further depicts removing the dielectric cap 25.

Figure 6:
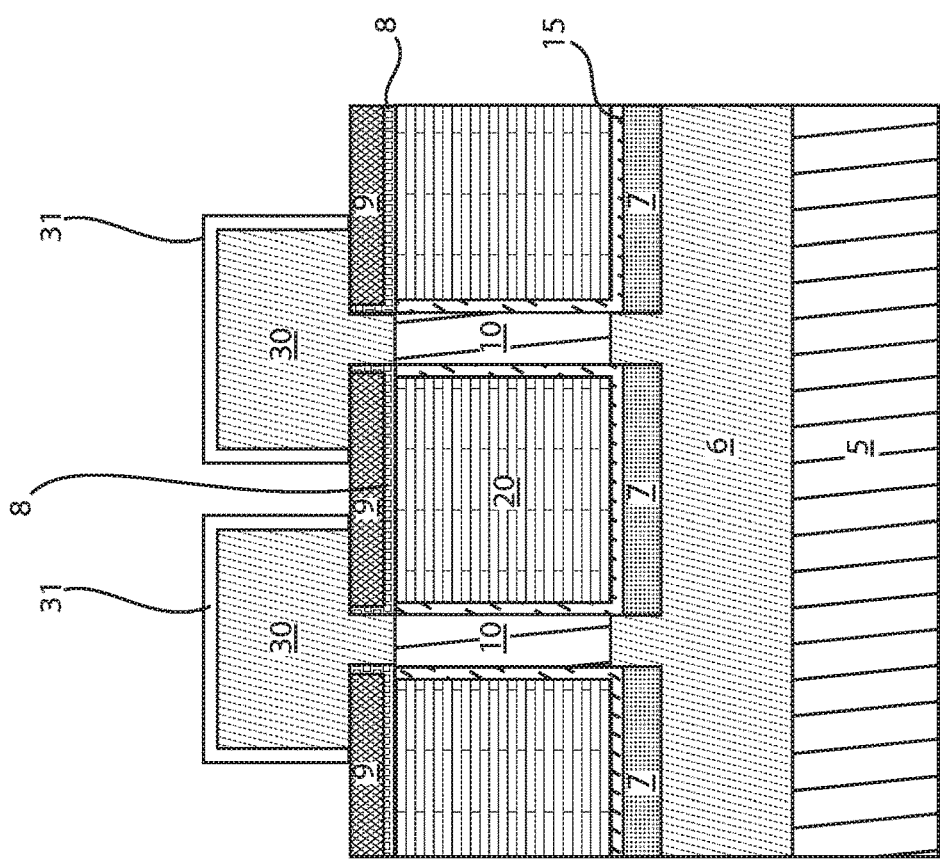
FIG. 6 is a side cross-sectional view depicting one embodiment of forming a sacrificial silicon and germanium containing conformal layer on the upper surface and substantially planar sidewalls of the second source/drain region.

FIG. 6 depicts one embodiment of forming a sacrificial silicon and germanium containing conformal layer 31 on the upper surface and substantially planar sidewalls of the second source/drain region 30. In one embodiment, the sacrificial silicon and germanium containing conformal layer 31 may be composed of silicon germanium. The sacrificial silicon and germanium containing conformal layer 31 may be formed using an epitaxial deposition process. As noted above, epitaxial deposition is a selective deposition process, which forms epitaxial material only on semiconductor containing depositions surfaces, e.g., the second source/drain region 30. The sacrificial silicon and germanium conformal layer 31 may have a thickness ranging from 1 nm to 10 nm. The formation of the sacrificial silicon and germanium containing conformal layer 31 can be optional in some cases, such as when the second source/drain region is composed of silicon germanium doped with boron (SiGe:B).

Figure 7:
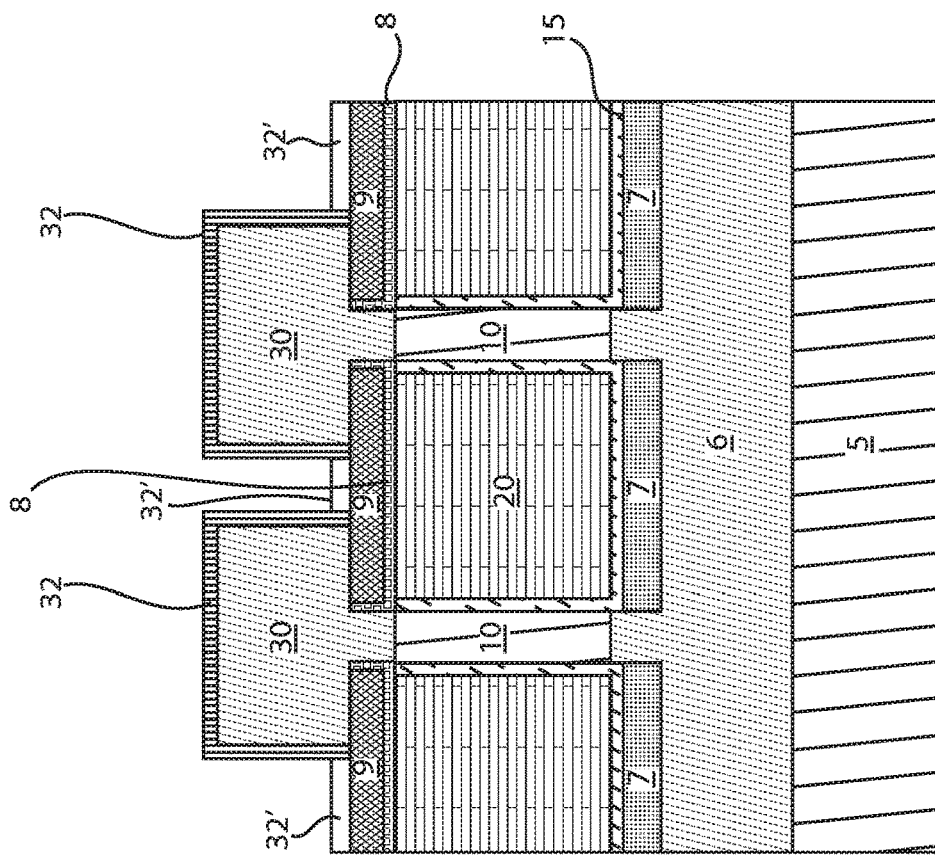
FIG. 7 is a side cross-sectional view is a side cross-sectional view depicting forming a germanium and oxygen containing layer on the sacrificial silicon and germanium containing conformal layer.

FIG. 7 depicts one embodiment of forming a germanium and oxygen containing layer 32' on the sacrificial silicon and germanium containing conformal layer 31. In one embodiments, the germanium and oxygen containing layer 32' is composed of germanium oxide (GeO$_2$). The germanium and oxygen containing layer 32' may be deposited using chemical vapor deposition (CVD) or atomic layer deposition (ALD). Examples of CVD processes suitable for forming the germanium and oxygen containing layer 32 include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed. The germanium and oxygen containing layer 32' may have a thickness ranging from 1 nm to 10 nm.

FIG. 7 further depicts converting the germanium and oxygen containing layer 32' to a silicon and oxygen containing layer 32. The oxygen containing layer 32 may be silicon oxide (SiO$_2$). The conversion of the germanium and oxygen containing layer 32' into the silicon and oxygen containing layer 32 may be by thermal anneal in a nitrogen gas (N$_2$), or argon gas (Ar), or helium (He) atmosphere. For example, the thermal anneal may be provided by furnace annealing, rapid thermal annealing, laser annealing, flash annealing or a combination thereof. The temperature of the thermal anneal for converting the germanium and oxygen containing layer 32' into the silicon and oxygen containing layer 32 may range from 400° C. to 600° C. In one example, a germanium oxide ($GeO_2$) layer present on the sidewall and upper surfaces of the second source/drain region may be converted to silicon oxide ($SiO_2$) by an anneal at temperatures less than 600° C. in a nitrogen ($N_2$) gas atmosphere.

Figure 8:
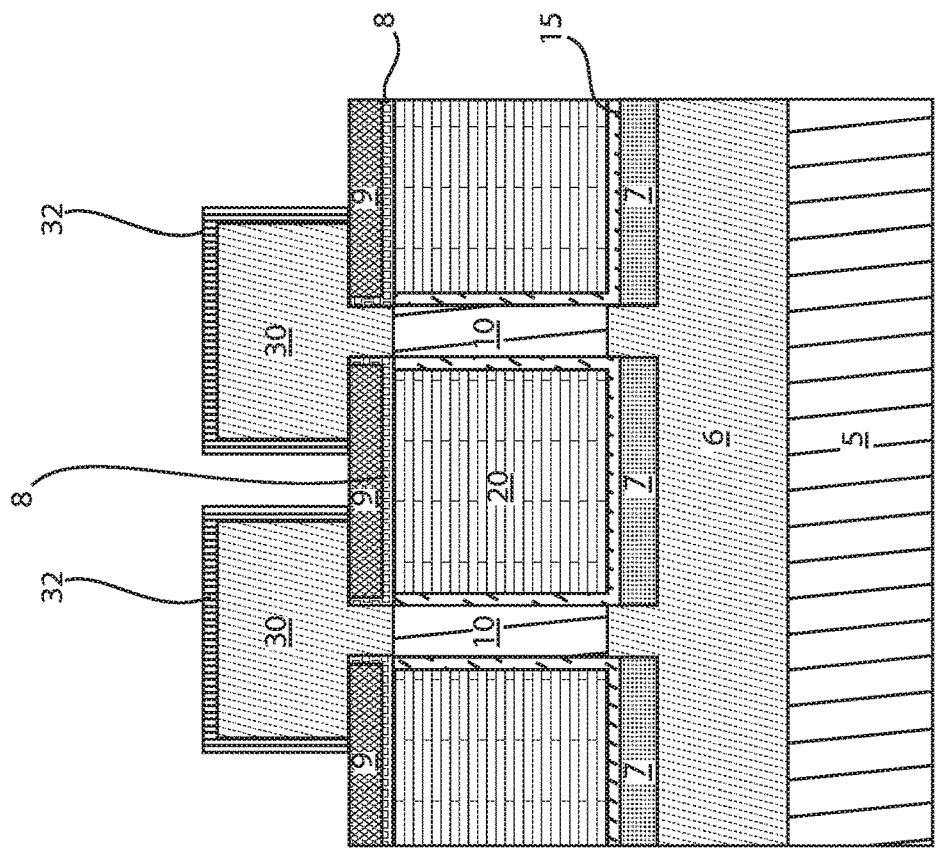
FIG. 8 is a side cross-sectional view depicting converting the germanium and oxygen containing layer to a silicon and oxygen containing layer by thermal anneal in a nitrogen gas ($N_2$) atmosphere.

Referring to FIGS. 7 and 8, during the conversion step, the portion of the germanium and oxygen containing layer 32', e.g., germanium oxide ($GeO_2$), that is overlying the germanium containing semiconductor material of the second source/drain region 30 reacts to provide the silicon and oxygen containing layer 32, e.g., silicon oxide ($SiO_2$). However, the portion of the germanium and oxygen containing layer 32' that is not present on the second source/drain region 30, but is on the dielectric material of the sacrificial dielectric spacer 9 does not react, i.e., is not converted to a silicon and oxygen containing layer 32. The portion of the germanium and oxygen containing layer 32' that is present on the dielectric material of the sacrificial dielectric spacer 9 remains a germanium and oxygen containing composition, e.g., germanium oxide ($GeO_2$). The non-reacted portion of the germanium and oxygen containing layer 32' that is present on the dielectric material of the sacrificial dielectric spacer 9 may be removed selectively to the converted silicon and oxygen containing layer 32, e.g., silicon oxide ($SiO_2$), by a deionized water wash.

Figure 9:
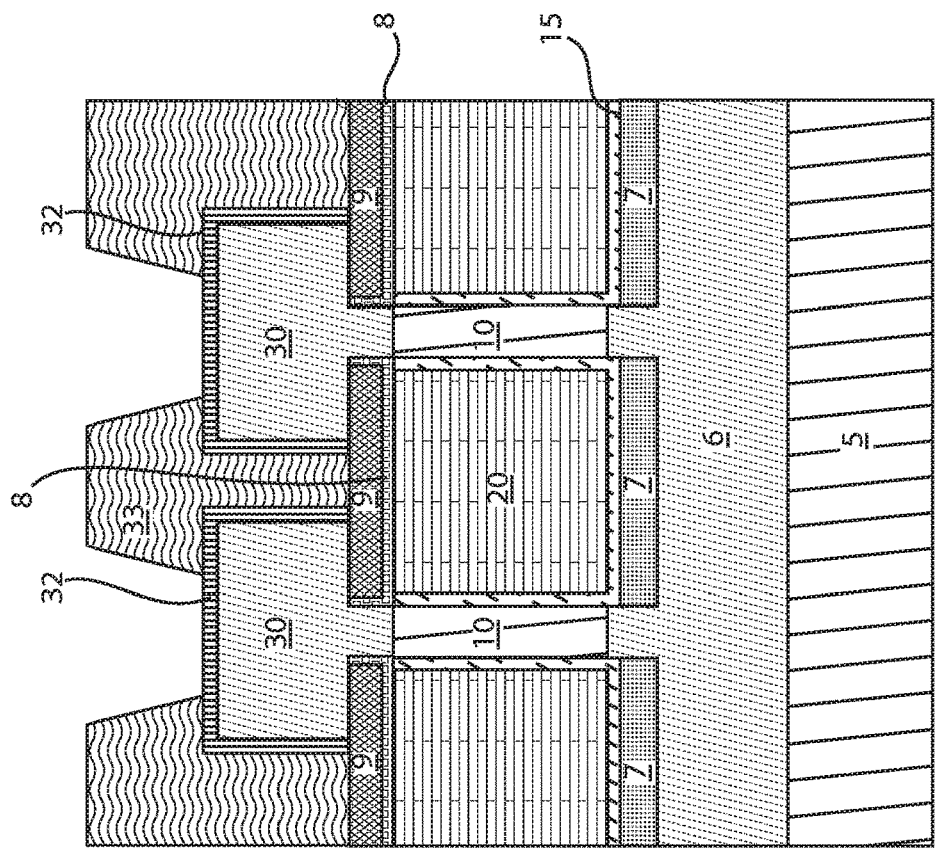
FIG. 9 is a side cross-sectional view depicting forming an encapsulating layer over on the silicon and oxygen containing layer and covering the second source/drain region; and forming a via opening through the encapsulating layer to expose a portion of the silicon and oxygen containing layer.

FIG. 9 depicts forming an encapsulating layer 33 over on the silicon and oxygen containing layer 32 and covering the second source/drain region 30; and forming a via openings 34 through the encapsulating layer 33 to expose a portion of the silicon and oxygen containing layer 32. In one embodiment, the encapsulating layer 33 may be composed of amorphous silicon (α-Si). The encapsulating layer 33 may be formed using chemical vapor deposition, e.g., plasma enhanced chemical vapor deposition (PECVD) or spin on deposition. The via openings 34 may be formed using selective etching in combination with a patterned photoresist mask. The patterned photoresist mask may be formed using deposition, photolithography and development process steps. The etch process may remove the amorphous silicon selectively to the converted silicon and oxygen containing layer 32.

Figure 10:
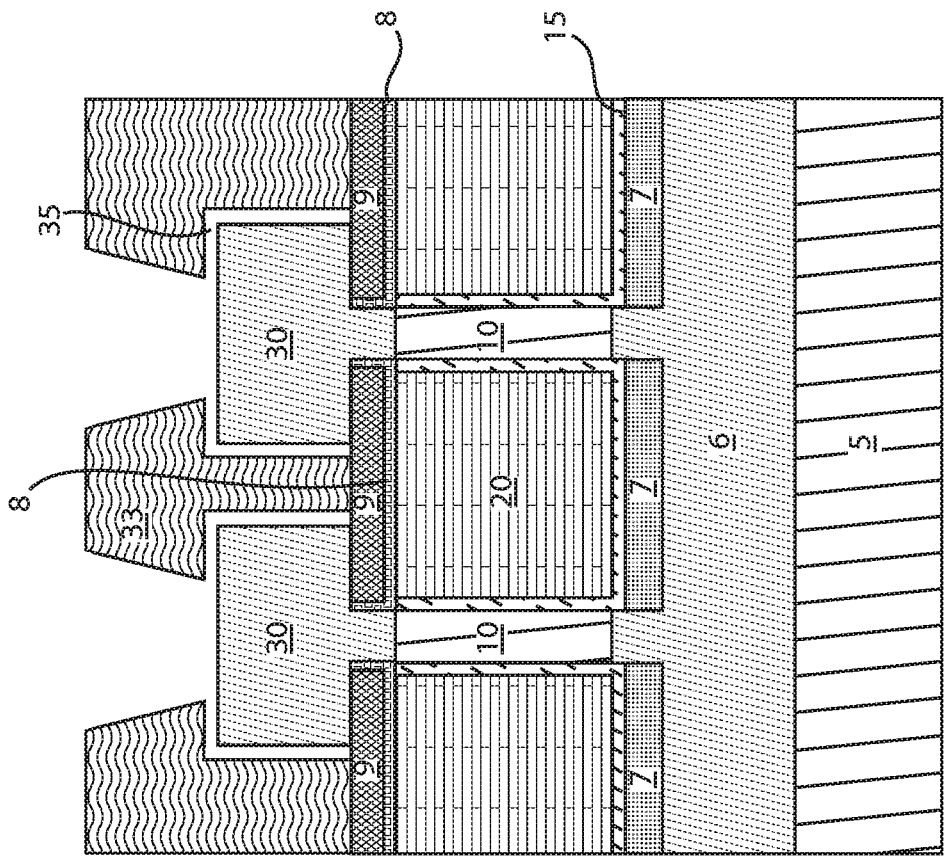
FIG. 10 is a side cross-sectional view depicting removing the silicon and oxygen containing layer with an etch that is selective to the second source/drain region and the encapsulating layer to form a passageway opening for the metal wrap around electrode.

FIG. 10 depicts one embodiment of removing the silicon and oxygen containing layer 32 with an etch that is selective to the second source/drain region 30 and the encapsulating layer 33 to form a passageway opening 35 for the metal wrap around electrode 50. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater. The silicon and oxygen containing layer 32 may be removed using a wet etch process, e.g., chemical wet etch, or dry etch process, e.g., plasma etch and/or gas etch. In some embodiments, removing the converted silicon and oxygen containing layer 32 provides a passageway opening 35 that extends across the entirety of the upper surface of the second source/drain region 30, as well as extending along an entirety of the sidewalls of the second source/drain region 30.

Figure 11:
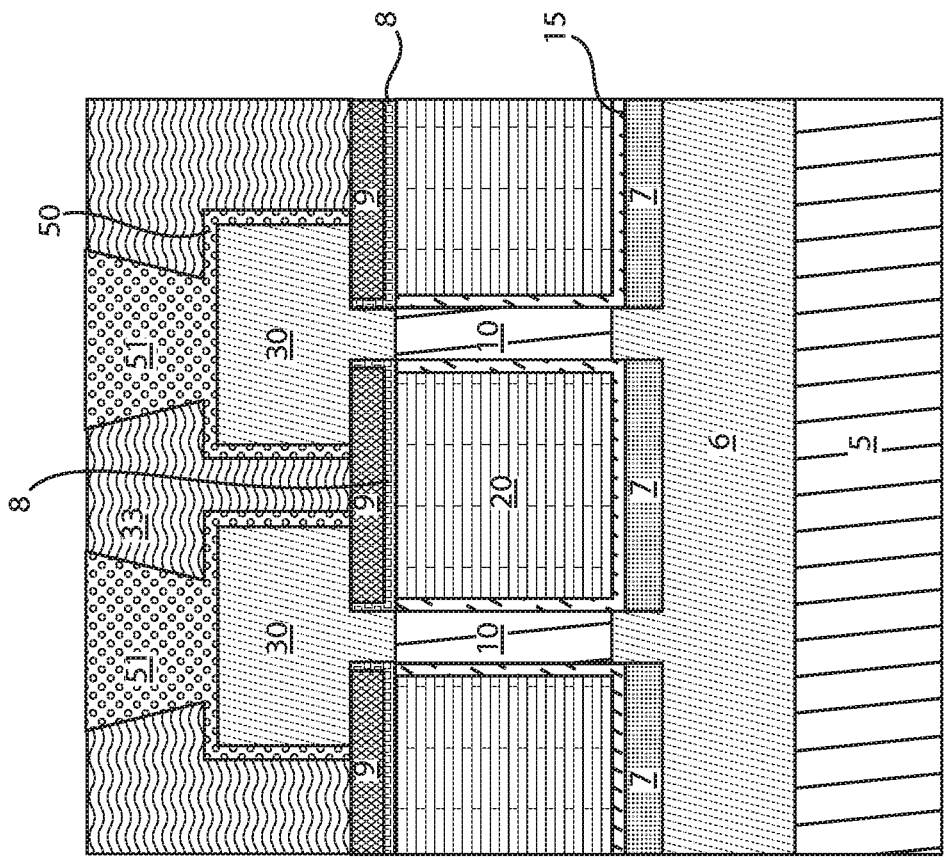
FIG. 11 is a side cross-sectional view depicting filling the passageway opening with a metal to provide the metal wrap around electrode.

FIG. 11 depicts filling the passageway opening with a metal to provide the metal wrap around contact 50. The metal wrap around contact (WAC) 50 fills the entire passageway around the second source/drain region 30. In some embodiments, the wrap around contact (WAC) extends across the entirety of the upper surface of the second source/drain region 30, as well as extending along an entirety of the sidewalls of the second source/drain region 30. The metal of the wrap around contact (WAC) 50 wraps all around the epitaxial semiconductor material of the second source/drain region 30 to reduce the contact resistance to the device.

In one embodiment, filling the passageway opening with metal to provide the metal wrap around contact 50 may include a chemical vapor deposition (CVD) process that employs two deposition stages. In one embodiment, the two-stage chemical vapor deposition process for forming the wrap around contact 50 includes a first deposition of titanium (Ti) followed by a second deposition or cobalt (Co) or tungsten (W). It is noted that this is only one example of a deposition process that can be used to form the wrap around contact (WAC), and it is not intended that the present disclosure be limited to only this example. For example, in some embodiments, the metal wrap around contact 50 may be formed using atomic layer deposition (ALD). Further the wrap around contact may be composed of any electrically conductive metal containing material, such as copper (Cu), aluminum (Al), tungsten (W), platinum (Pt), titanium (Ti), silver (Ag), tantalum (Ta), tantalum nitride (TaN), tungsten nitride (WN), titanium nitride (TiN) and combinations thereof. Additionally, the deposition process steps for forming the wrap around contacts (WAC) 50 may also fill the via openings forming contact vias 36 to the wrap around contacts (WAC) 50.

Figure 12:
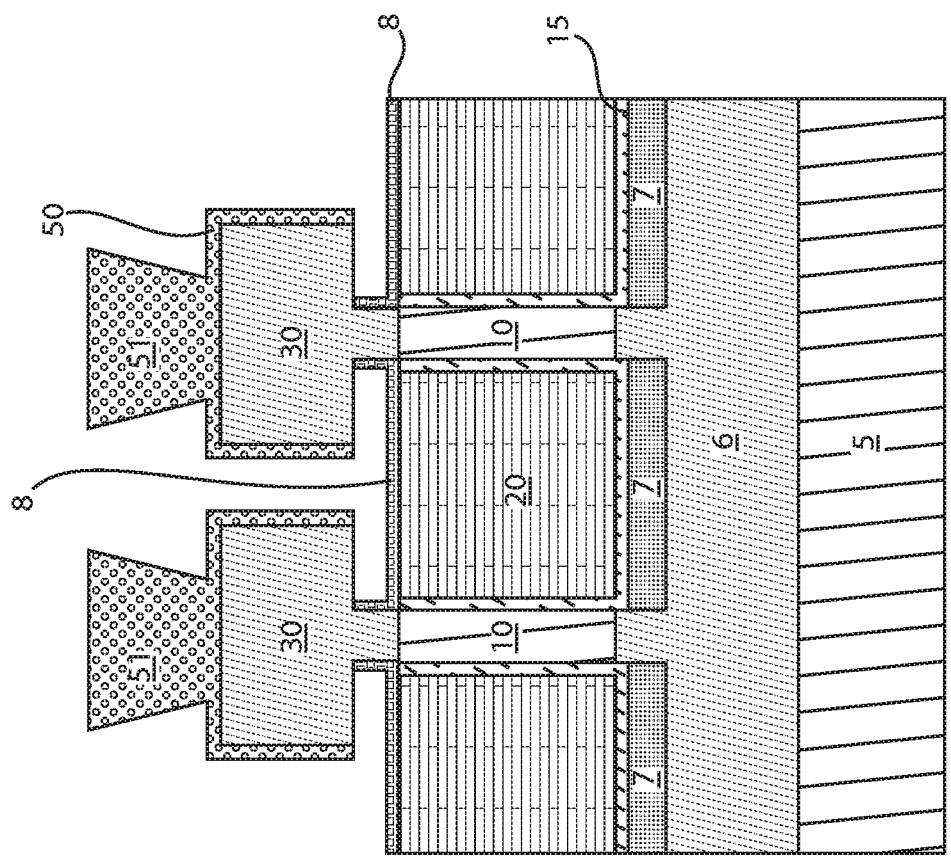
FIG. 12 is a side cross-sectional view depicting removing the encapsulating dielectric to provide an opening adjacent to the substantially planar sidewalls of the source/drain regions between at least two semiconductor fin structures.

FIG. 12 depicts one embodiment of removing the encapsulating dielectric 33 to provide an opening adjacent to the substantially planar sidewalls of the second source/drain regions 30 between at least two semiconductor fin structures 10. The encapsulating dielectric 33, e.g., amorphous silicon, may be removed by an etch that is selective to the wrap around contact 50, contact vias 35 and the sacrificial dielectric spacer 9. The etch process for removing the encapsulating dielectric 33 may be a wet etch, e.g., wet chemical etch, or a dry etch, e.g., plasma etch, or gas etch.

Figure 13:
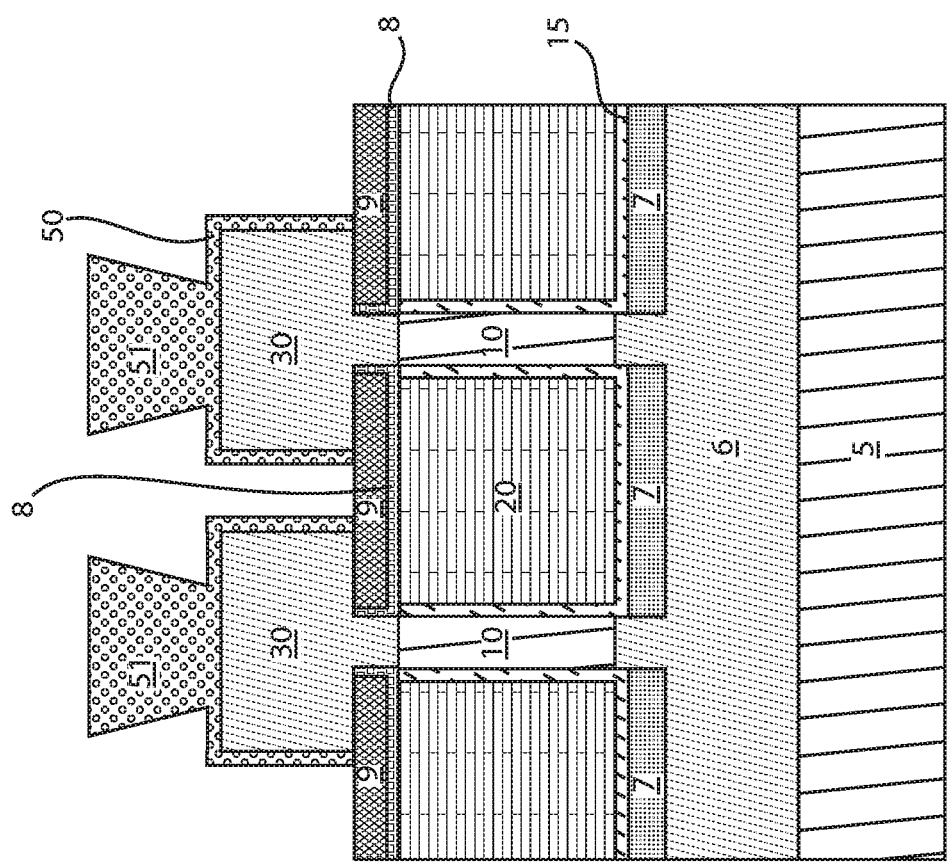
FIG. 13 is a side cross-sectional view depicting removing the nitride containing dielectric of the isolation stack selectively to an etch stop liner atop the gate structure to providing an opening between a bottom surface of the second source/drain region and the gate structure.

FIG. 13 depicts one embodiment of removing the sacrificial dielectric spacer 9 selectively to an etch stop liner 8 that is atop the gate structure 20, 15 to providing an opening between a bottom surface of the second source/drain region 30 and the gate structure 20, 15. The etch process for removing the sacrificial dielectric spacer 9 may be a wet etch, e.g., wet chemical etch, or a dry etch, e.g., plasma etch or gas etch.

Figure 14:
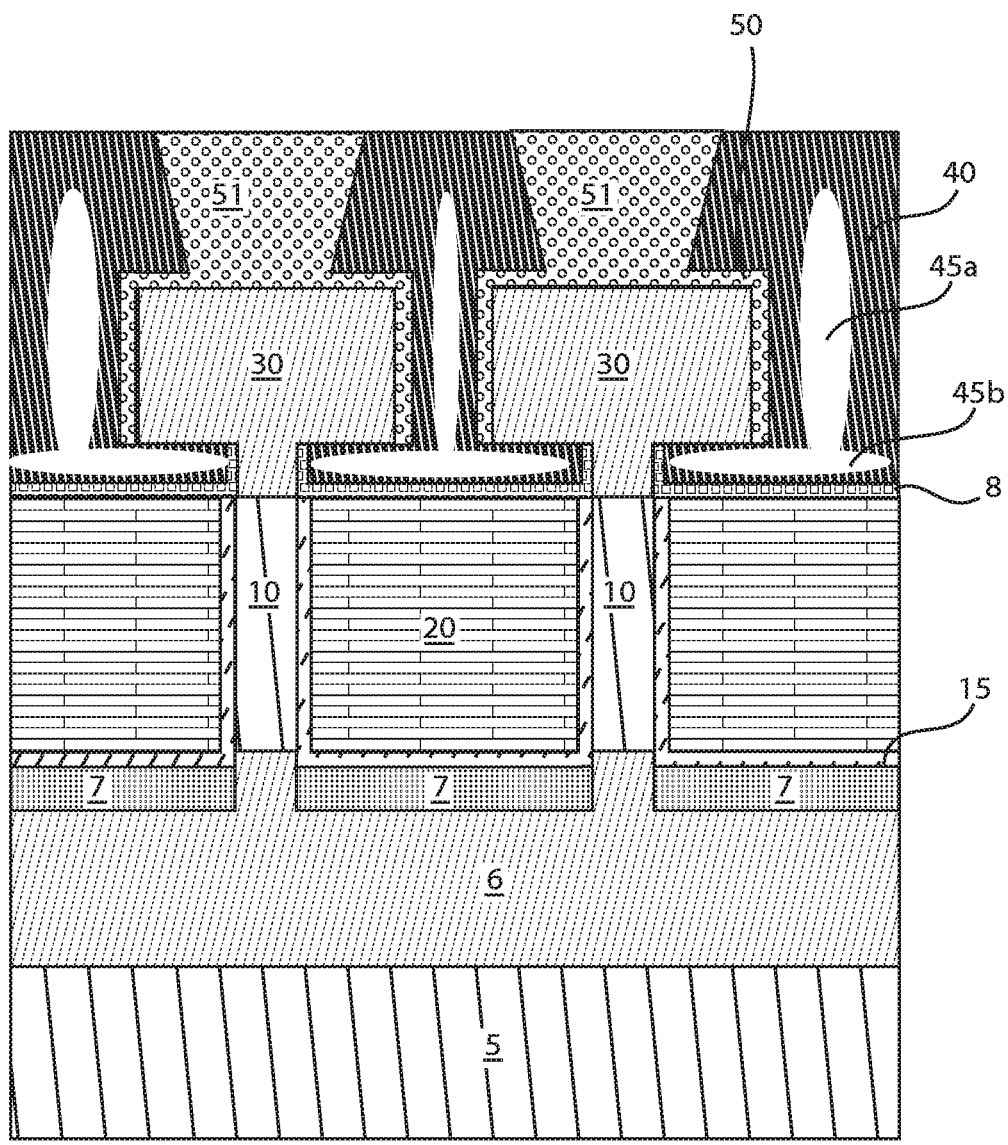
FIG. 14 is a side cross-sectional view depicting depositing a dielectric material that pinches off in the openings to form air gaps.

FIG. 14 depicts one embodiment of depositing a dielectric material 40 that pinches off in the openings to form air gaps 45a, 45b. The dielectric material 40 may be an oxide containing dielectric, but any dielectric material that can be non-conformally deposited and form an air gap may be considered for the dielectric material 40 that pinches off in the openings to form air gaps 45a, 45b. For example, the dielectric material 40 may be silicon oxide ($SiO_2$) that may be deposited using chemical vapor deposition (CVD) that can deliver non-conformal deposition performance. Non-conformal deposition can be performed using plasma enhanced chemical vapor deposition (PECVD). In some embodiments, the etch stop layer 8 protects the gate structure 20, 15 during the formation of the air gaps 45a, 45b. The non-conformal nature of the deposition process provides the dielectric 40 being deposited pinches off in deposition openings trapping air within, i.e., forming an air gap 45a, 45b.

In some embodiments, a semiconductor device is provided by the method described with reference to FIGS. 1-14 that can include at least two semiconductor fin structures 10 having sidewalls with {100} crystalline planes that is present atop a supporting substrate 5. A source/drain region 30 extends in a lateral direction from the sidewalls of each fin structure 10 of the at least two semiconductor fin structures 10 having sidewalls with {100} crystalline planes, wherein the source/drain regions 30 have substantially planar sidewalls and are present at an end of each of the fin structures 10 opposite an end that is in contact with the supporting substrate 5. A metal wrap around electrode 50 is present on an upper surface and the substantially planar sidewalls of the source/drain regions 30.

Air gaps 45a, 45b are present between the source/drain regions 30 of the at least two semiconductor fin structures 5. The air gaps 45a, 45b minimize parasitic capacitance. The air gaps include a first set of vertically oriented gaps 45a that are positioned between the substantially planar sidewalls of the source/drain regions 30 of the at least two semiconductor fin structures 10. The air gaps also include a second set of horizontally oriented gaps 45b that extend under an edge of the source/drain regions 30.

Having described preferred embodiments of a reduction of top source/drain external resistance and parasitic capacitance in vertical transistors it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device comprising:
  at least two semiconductor fin structures having sidewalls with {100} crystalline planes that is present atop a supporting substrate;
  a source/drain region extending in a lateral direction from the sidewalls of each fin structure of the at least two semiconductor fin structures having sidewalls with {100} crystalline planes, wherein the source/drain region has substantially planar sidewalls and are present at an end of each of the fin structures opposite an end that is in contact with the supporting substrate;
  a metal wrap around electrode on an upper surface and the substantially planar sidewalls of the source/drain region; and
  air gaps between the source/drain regions of the at least two semiconductor fin structures.

2. The semiconductor device of claim 1, wherein the at least two semiconductor fin structures are comprised of silicon (Si).

3. The semiconductor device of claim 1, wherein the source/drain region is in an epitaxial relationship with the sidewall of the at least two semiconductor fin structures.

4. The semiconductor device of claim 1, wherein the air gaps include a first set of vertically oriented gaps that are positioned between the substantially planar sidewalls of the source/drain regions of the at least two semiconductor fin structures.

5. The semiconductor device of claim 4, wherein the air gaps include a second set of horizontally oriented gaps that extend under an edge of the source/drain region.

6. The semiconductor device of claim 1, further comprising a gate structure present on a channel region portion of the at least two semiconductor fin structures.

7. The semiconductor device of claim 6, wherein the gate structure comprises at least one gate electrode present on at least one gate dielectric.

8. The semiconductor device of claim 7, wherein the at least one gate electrode comprises an n-type work function metal.

9. The semiconductor device of claim 7, wherein the at least one gate electrode comprises a p-type work function metal.

10. The semiconductor device of claim 1, wherein the semiconductor device is vertical field effect transistor.

11. A semiconductor device comprising:
  at least two semiconductor fin structures having sidewalls with {100} crystalline planes that is present atop a supporting substrate;
  a source/drain region extending in a lateral direction from the sidewalls of each fin structure of the at least two semiconductor fin structures having sidewalls with {100} crystalline planes, wherein the source/drain region has substantially planar sidewalls and are present at an end of each of the fin structures opposite an end that is in contact with the supporting substrate;
  a wrap around electrode on an upper surface and the substantially planar sidewalls of the source/drain region; and
  air gaps between the source/drain regions of the at least two semiconductor fin structures, wherein the air gaps include vertically oriented gaps that are positioned between the substantially planar sidewalls of the source/drain regions of the at least two semiconductor fin structures.

12. The semiconductor device of claim 11, wherein the at least two semiconductor fin structures are comprised of silicon (Si).

13. The semiconductor device of claim 11, wherein the source/drain region is in an epitaxial relationship with the sidewall of the at least two semiconductor fin structures.

14. The semiconductor device of claim 11, further comprising a gate structure present on a channel region portion of the at least two semiconductor fin structures.

15. The semiconductor device of claim 11, wherein the semiconductor device is vertical field effect transistor.

16. A semiconductor device comprising:
  at least two semiconductor fin structures having sidewalls with {100} crystalline planes that is present atop a supporting substrate;
  a source/drain region extending in a lateral direction from the sidewalls of each fin structure of the at least two semiconductor fin structures having sidewalls with {100} crystalline planes, wherein the source/drain regions have substantially planar sidewalls and are present at an end of each of the fin structures opposite an end that is in contact with the supporting substrate;
  a wrap around electrode on an upper surface and the substantially planar sidewalls of the source/drain region; and
  air gaps between the source/drain regions of the at least two semiconductor fin structures, wherein the air gaps include a set of horizontally oriented gaps that extend under an edge of the source/drain region.

17. The semiconductor device of claim 16, wherein the at least two semiconductor fin structures are comprised of silicon (Si).

18. The semiconductor device of claim 16, wherein the source/drain region is in an epitaxial relationship with the sidewall of the at least two semiconductor fin structures.

19. The semiconductor device of claim 16, further comprising a gate structure present on a channel region portion of the at least two semiconductor fin structures.

20. The semiconductor device of claim 16, wherein the semiconductor device is vertical field effect transistor.

* * * * *